(12) United States Patent
Ku

(10) Patent No.: US 12,417,810 B2
(45) Date of Patent: Sep. 16, 2025

(54) VOLTAGE CONTROL CIRCUIT MODULE, MEMORY STORAGE DEVICE AND VOLTAGE CONTROL METHOD

(71) Applicant: PHISON ELECTRONICS CORP., Miaoli (TW)

(72) Inventor: Po-Chih Ku, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 117 days.

(21) Appl. No.: 18/433,421

(22) Filed: Feb. 6, 2024

(65) Prior Publication Data

US 2025/0182830 A1 Jun. 5, 2025

(30) Foreign Application Priority Data

Dec. 4, 2023 (TW) .................................. 112147094

(51) Int. Cl.
*G11C 7/10* (2006.01)
*G06F 3/06* (2006.01)
*G11C 16/30* (2006.01)
*G11C 16/32* (2006.01)
*H02M 3/158* (2006.01)

(52) U.S. Cl.
CPC ............ *G11C 16/30* (2013.01); *G06F 3/0625* (2013.01); *G06F 3/0655* (2013.01); *G06F 3/0679* (2013.01); *G11C 16/32* (2013.01); *H02M 3/158* (2013.01); *G11C 7/10* (2013.01)

(58) Field of Classification Search
CPC ..................................................... G11C 7/1006
See application file for complete search history.

(56) References Cited

U.S. PATENT DOCUMENTS 10,706,896 B2 * 7/2020 Riley ................... G11C 7/1006

* cited by examiner

*Primary Examiner* — Jason Lappas
(74) *Attorney, Agent, or Firm* — JCIPRNET

(57) ABSTRACT

A voltage control circuit module, a memory storage device, and a voltage control method are disclosed. The method includes: generating, by a first oscillation circuit, a first oscillation signal according to a feedback control signal; generating, by a second oscillation circuit, a second oscillation signal according to the feedback control signal; generating an output voltage according to the first oscillation signal and the second oscillation signal; generating the feedback control signal according to the output voltage; and locking at least one of a frequency difference and a phase difference between the first oscillation signal and the second oscillation signal according to the first oscillation signal and the second oscillation signal.

30 Claims, 9 Drawing Sheets

VOLTAGE CONTROL CIRCUIT MODULE, MEMORY STORAGE DEVICE AND VOLTAGE CONTROL METHOD

CROSS-REFERENCE TO RELATED APPLICATION

This application claims the priority benefit of Taiwan application serial no. 112147094, filed on Dec. 4, 2023. The entirety of the above-mentioned patent application is hereby incorporated by reference herein and made a part of this specification.

BACKGROUND OF THE INVENTION

Field of the Invention

The invention relates to a voltage control circuit module, a memory storage device, and a voltage control method.

Description of Related Art

Portable electronic devices such as mobile phones and notebook computers have grown rapidly in the past few years, which has led to a rapid increase in consumer demand for storage media. Since a rewritable non-volatile memory module (such as a flash memory) has characteristics such as data non-volatility, power-saving, small size, and lack of mechanical structures, the rewritable non-volatile memory module is very suitable to be built into the various portable electronic devices provided above. In a memory storage device including a rewritable non-volatile memory module, most electronic circuit elements (such as memory controllers) are quite sensitive to voltage changes. In particular, when the received voltage is changed too significantly, data reading errors, data writing errors, or device abnormalities may occur.

SUMMARY OF THE INVENTION

The invention provides a voltage control circuit module, a memory storage device, and a voltage control method that may improve the voltage control efficiency of an output voltage.

An exemplary embodiment of the invention provides a voltage control circuit module including a first oscillation circuit, a second oscillation circuit, a voltage output circuit, a feedback control circuit, and an injection lock circuit. The voltage output circuit is coupled to the first oscillation circuit and the second oscillation circuit. The feedback control circuit is coupled to the first oscillation circuit, the second oscillation circuit, and the voltage output circuit. The injection lock circuit is coupled to the first oscillation circuit and the second oscillation circuit. The first oscillation circuit is configured to generate a first oscillation signal according to a feedback control signal. The second oscillation circuit is configured to generate a second oscillation signal according to the feedback control signal. The voltage output circuit is configured to generate an output voltage according to the first oscillation signal and the second oscillation signal. The feedback control circuit is configured to generate the feedback control signal according to the output voltage. The injection lock circuit is configured to lock at least one of a frequency difference and a phase difference between the first oscillation signal and the second oscillation signal according to the first oscillation signal and the second oscillation signal.

An exemplary embodiment of the invention further provides a memory storage device including a connection interface unit, a rewritable non-volatile memory module, a memory control circuit unit, and a voltage control circuit module. The connection interface unit is configured to be coupled to a host system. The memory control circuit unit is coupled to the connection interface unit and the rewritable non-volatile memory module. The voltage control circuit module is disposed in the connection interface unit, the rewritable non-volatile memory module, or the memory control circuit unit. The voltage control circuit module is configured to: generate, by a first oscillation circuit, a first oscillation signal according to a feedback control signal; generate, by a second oscillation circuit, a second oscillation signal according to the feedback control signal; generate an output voltage according to the first oscillation signal and the second oscillation signal; generate the feedback control signal according to the output voltage; and lock at least one of a frequency difference and a phase difference between the first oscillation signal and the second oscillation signal according to the first oscillation signal and the second oscillation signal.

An exemplary embodiment of the invention further provides a voltage control method used in a memory storage device. The voltage control method includes: generating, by a first oscillation circuit, a first oscillation signal according to a feedback control signal; generating, by a second oscillation circuit, a second oscillation signal according to the feedback control signal; generating an output voltage according to the first oscillation signal and the second oscillation signal; generating the feedback control signal according to the output voltage; and locking at least one of a frequency difference and a phase difference between the first oscillation signal and the second oscillation signal according to the first oscillation signal and the second oscillation signal.

Based on the above, in a system architecture in which the plurality of oscillation circuits generate the oscillation signals respectively, the plurality of oscillation signals may be configured to jointly generate the output voltage. In addition, the injection lock circuit additionally disposed in the architecture may be configured to mutually lock the frequency difference and/or the phase difference between the oscillation signals according to the oscillation signals. Thereby, the voltage control efficiency of the output voltage under this system architecture may be improved.

DESCRIPTION OF THE EMBODIMENTS

A plurality of exemplary embodiments are presented below to illustrate the invention, but the invention is not limited to the plurality of exemplary embodiments illustrated. Appropriate combinations are also allowed between the exemplary embodiments. The term "coupled" used in the entire text of the specification of the present application (including claims) may refer to any direct or indirect connecting means. For example, if it is described in the text that a first device is coupled to a second device, it should be interpreted as that the first device may be directly connected to the second device, or the first device may be indirectly connected to the second device via other devices or some connecting means. Additionally, the term "signal" may refer to at least one current, voltage, charge, temperature, data, or any other signal or a plurality of signals.

Figure 1:
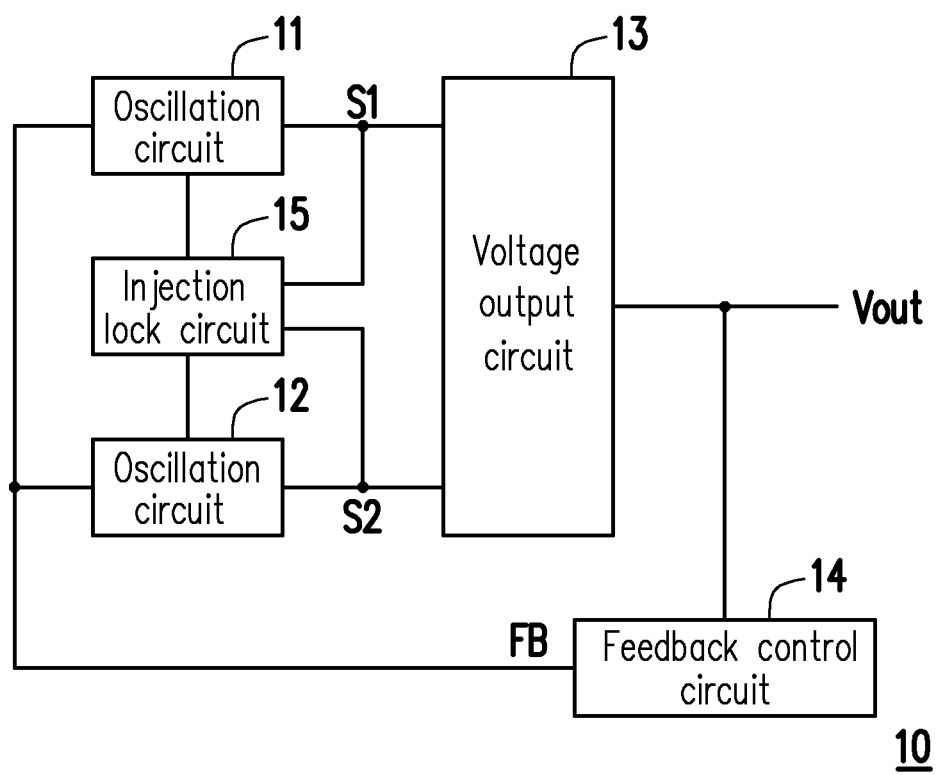
FIG. 1 is a schematic diagram of a voltage control circuit module shown according to an exemplary embodiment of the invention.

FIG. 1 is a schematic diagram of a voltage control circuit module shown according to an exemplary embodiment of the invention. Referring to FIG. 1, a voltage control circuit module 10 may be configured to generate a qualified voltage (also referred to as an output voltage) Vout according to a reference voltage. For example, the voltage control circuit module 10 may boost or buck the reference voltage to generate the voltage Vout. The voltage Vout may then be supplied to one or a plurality of electronic circuits to drive the electronic circuits.

The voltage control circuit module 10 includes an oscillation circuit (also referred to as a first oscillation circuit) 11, an oscillation circuit (also referred to as a second oscillation circuit) 12, a voltage output circuit 13, a feedback control circuit 14, and an injection lock circuit 15. The oscillation circuit 11 is coupled to the feedback control circuit 14. The oscillation circuit 11 is configured to receive a signal (also referred to as a feedback control signal) FB from the feedback control circuit 14 and generate a signal (also referred to as a first oscillation signal) S1 according to the signal FB. For example, one or a plurality of pulse waves may be periodically included in the signal S1.

The oscillation circuit 12 is coupled to the feedback control circuit 14. The oscillation circuit 12 is configured to receive the signal FB from the feedback control circuit 14 and generate a signal (also referred to as the second oscillation signal) S2 according to the signal FB. For example, one or a plurality of pulse waves may also be periodically included in the signal S2.

The voltage output circuit 13 is coupled to the oscillation circuits 11 and 12. The voltage output circuit 13 is configured to receive the signal S1 from the oscillation circuit 11 and the signal S2 from the oscillation circuit 12. Then, the voltage output circuit 13 may generate the voltage Vout according to the signals S1 and S2. For example, the voltage output circuit 13 may be configured to perform current summation and low-pass filtering on the signals S1 and/or S2 to generate the voltage Vout.

The feedback control circuit 14 is coupled to the oscillation circuit 11, the oscillation circuit 12, and the voltage output circuit 13. The feedback control circuit 14 is configured to generate the signal FB according to the reference voltage and the voltage Vout. The signal FB may reflect the status of the voltage Vout. For example, the voltage value of the signal FB may be directly related to the voltage value of the voltage Vout. In an exemplary embodiment, the signal FB may also reflect the voltage difference between the reference voltage and the voltage Vout. For example, the voltage value of the signal FB may be positively related to the voltage difference between the reference voltage and the voltage Vout.

The injection lock circuit 15 is coupled to the oscillation circuit 11, the oscillation circuit 12, and the voltage output circuit 13. The injection lock circuit 15 is configured to lock the frequency difference and/or the phase difference between the signals S1 and S2 according to the signals S1 and S2. For example, the injection lock circuit 15 may be configured to lock the frequency difference between the signals S1 and S2 to a specific frequency difference (also referred to as the target frequency difference) and/or lock the phase difference between the signals S1 and S2 to a specific phase difference (also referred to as the target phase difference).

In an exemplary embodiment, the injection lock circuit 15 may perform mutual locking between at least one pulse wave in the signal S1 and at least one pulse wave in the signal S2 according to the signals S1 and S2. For example, the locking may refer to the locking of the relative position between at least one pulse wave in the signal S1 and at least one pulse wave in the signal S2.

In an exemplary embodiment, locking the relative position between at least one pulse wave in the signal S1 and at least one pulse wave in the signal S2 is equivalent to locking the frequency difference and/or the phase difference between the signals S1 and S2. In an exemplary embodiment, compared with the frequency difference and/or the phase difference between the signals S1 and S2 continuing to change (i.e., the frequency difference and/or the phase difference between the signals S1 and S2 is/are not locked), when the frequency difference and/or the phase difference between the signals S1 and S2 are locked, the quality of the generated voltage Vout may be improved (for example, the voltage Vout having a specific voltage value may be stably output).

Figure 2:
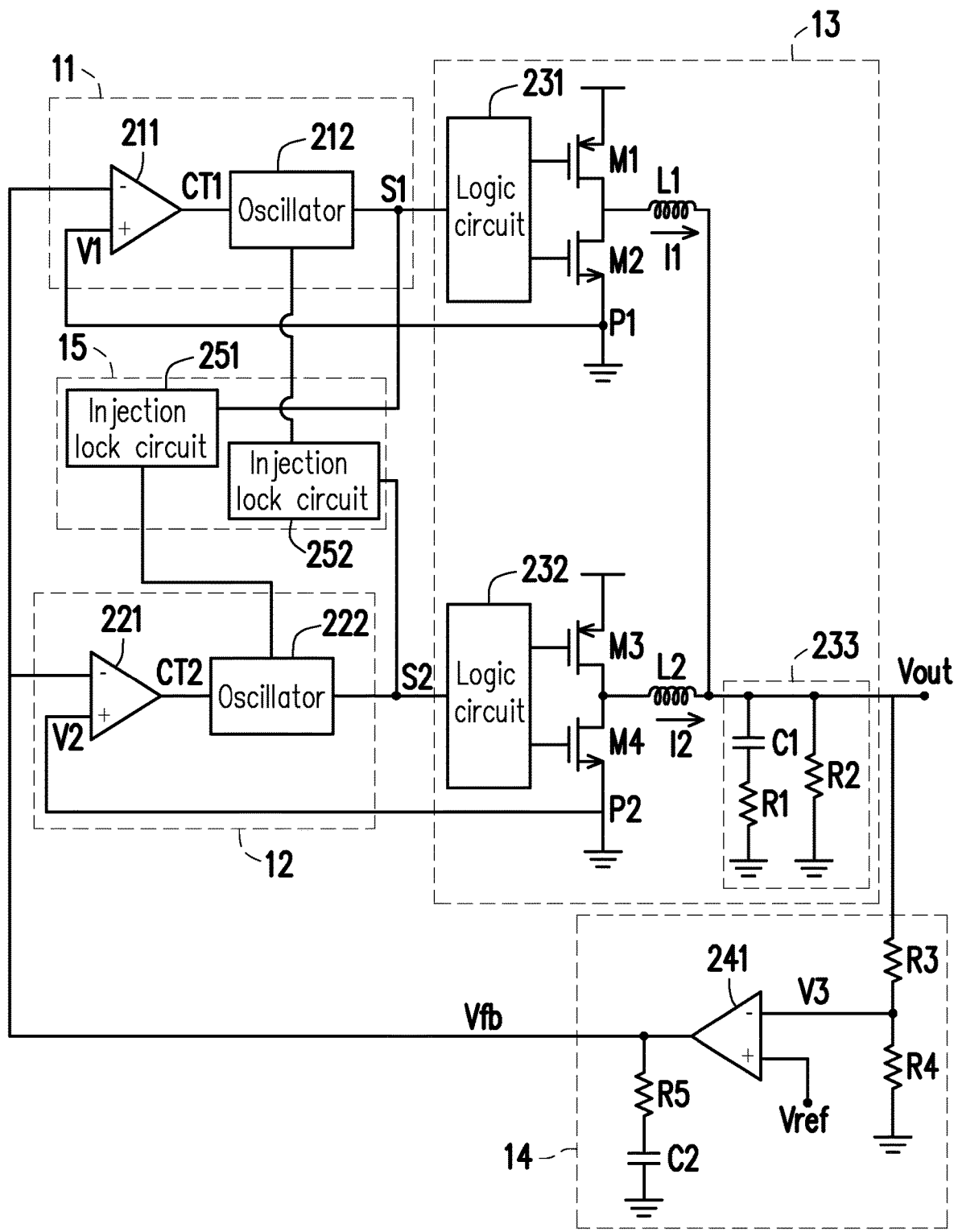
FIG. 2 is a schematic diagram of a voltage control circuit module shown according to an exemplary embodiment of the invention.

FIG. 2 is a schematic diagram of a voltage control circuit module shown according to an exemplary embodiment of the invention. Referring to FIG. 2, in an exemplary embodiment, the oscillation circuit 11 may include a comparator 211 and an oscillator 212. The comparator 211 may be configured to receive voltages Vfb and V1 and generate a signal CT1 according to the voltage difference between the voltages Vfb and V1. The signal CT1 may reflect the voltage difference between the voltages Vfb and V1. For example, the comparator 211 may be an error amplifier, and the type of the comparator 211 is not limited thereto. The oscillator 212 is coupled to the comparator 211. The oscillator 212 may receive the signal CT1 and generate the signal S1 according to the signal CT1.

In an exemplary embodiment, the oscillation circuit 12 may include a comparator 221 and an oscillator 222. The comparator 221 may be configured to receive voltages Vfb and V2 and generate a signal CT2 according to the voltage difference between the voltages Vfb and V2. The signal CT2 may reflect the voltage difference between the voltages Vfb and V2. For example, the comparator 221 may also be an error amplifier, and the type of the comparator 221 is not limited thereto. The oscillator 222 is coupled to the comparator 221. The oscillator 222 may receive the signal CT2 and generate the signal S2 according to the signal CT2.

In an exemplary embodiment, the signal CT1 may be configured to turn on or off the oscillator 212. When the oscillator 212 is on, the oscillator 212 may output the signal S1. However, when the oscillator 212 is not on, the oscillator 212 does not output the signal S1.

In an exemplary embodiment, the signal CT2 may be configured to turn on or off the oscillator 222. When the oscillator 222 is on, the oscillator 222 may output the signal S2. However, when the oscillator 222 is not on, the oscillator 222 does not output the signal S2.

In an exemplary embodiment, at a certain time point (also referred to as a first time point), the oscillators 212 and 222 may be in an on state at the same time. In an exemplary embodiment, at a certain time point (also referred to as the second time point), only one of the oscillators 212 and 222 is in the on state, and the other one of the oscillators 212 and 222 is in the off state.

In an exemplary embodiment, the voltage output circuit 13 may include a boost or buck converter. In an exemplary embodiment, the voltage output circuit 13 may include a buck converter or a similar voltage output circuit having an architecture such as current mode (CM), current mode-constant on-time (CMCOT), or advanced constant on-time (ADVANCED-COT).

In an exemplary embodiment, the voltage output circuit 13 may include a logic circuit 231, a logic circuit 232, a low-pass filter circuit 233, transistors M1 to M4, and inductors L1 and L2. The logic circuit 231 is coupled to the oscillator 212 and configured to receive the signal S1. The logic circuit 231, the transistor M1, the transistor M2, and the inductor L1 may generate a current (also referred to as a first induced current) I1 on the inductor L1 according to the signal S1. The logic circuit 232 is coupled to the oscillator 222 and configured to receive the signal S2. The logic circuit 232, the transistor M3, the transistor M4, and the inductor L2 may generate a current (also referred to as a second induced current) I2 on the inductor L2 according to the signal S2. The low-pass filter circuit 233 may perform low-pass filtering on the currents I1 and I2 to generate the voltage Vout. For example, the low-pass filter circuit 233 may include a capacitor C1 and resistors R1 and R2. In addition, the voltage output circuit 13 may generate the voltage V1 at a sensing point P1 and the voltage V2 at a sensing point P2. The voltage V1 may be provided to the comparator 211. The voltage V2 may be provided to the comparator 221.

In an exemplary embodiment, the feedback control circuit 14 may include a comparator 241, resistors R3 to R5, and a capacitor C2. The resistors R3 and R4 may form a voltage divider circuit. The voltage divider circuit may be configured to divide the voltage Vout to generate a voltage V3. For example, the voltage value of the voltage V3 may be directly related to the voltage value of the voltage Vout. The comparator 241 may receive the voltages (i.e., reference voltage) Vref and V3 and generate the voltage Vfb according to the voltage difference between the voltages Vref and V3. The voltage Vfb may reflect the voltage difference between the voltages Vref and V3. In an exemplary embodiment, the signal FB of FIG. 1 may include the voltage Vfb. The voltage Vfb may be provided to the comparators 211 and 221.

In an exemplary embodiment, the injection lock circuit 15 includes an injection lock circuit (also referred to as a first injection lock circuit) 251 and an injection lock circuit (also referred to as a second injection lock circuit) 252. The injection lock circuit 251 is coupled to the output terminal of the oscillation circuit 11 and the input terminal (or control terminal) of the oscillation circuit 12. The injection lock circuit 252 is coupled to the output terminal of the oscillation circuit 12 and the input terminal (or control terminal) of the oscillation circuit 11.

In an exemplary embodiment, the injection lock circuit 251 may be configured to adjust the edge position of at least one pulse wave (also referred to as the second pulse wave) in the signal S2 according to at least one pulse wave (also referred to as the first pulse wave) in the signal S1. For example, the edge position of the second pulse wave may correspond to the rising edge and/or falling edge of the second pulse wave. In an exemplary embodiment, the edge position of the second pulse wave may include a rising edge position and/or a falling edge position of the second pulse wave. In an exemplary embodiment, the injection lock circuit 252 may be configured to adjust the edge position of at least one pulse wave (also referred to as the fourth pulse wave) in the signal S1 according to at least one pulse wave (also referred to as the third pulse wave) in the signal S2. For example, the edge position of the third pulse wave may correspond to the rising edge and/or falling edge of the third pulse wave. In an exemplary embodiment, the edge position of the third pulse wave may include a rising edge position and/or a falling edge position of the third pulse wave. In an exemplary embodiment, by adjusting the edge positions (such as rising edge position and/or falling edge position) of at least a portion of the pulse waves in the signals S1 and S2, the frequency difference and/or the phase difference between the signals S1 and S2 may be locked.

Figure 3:
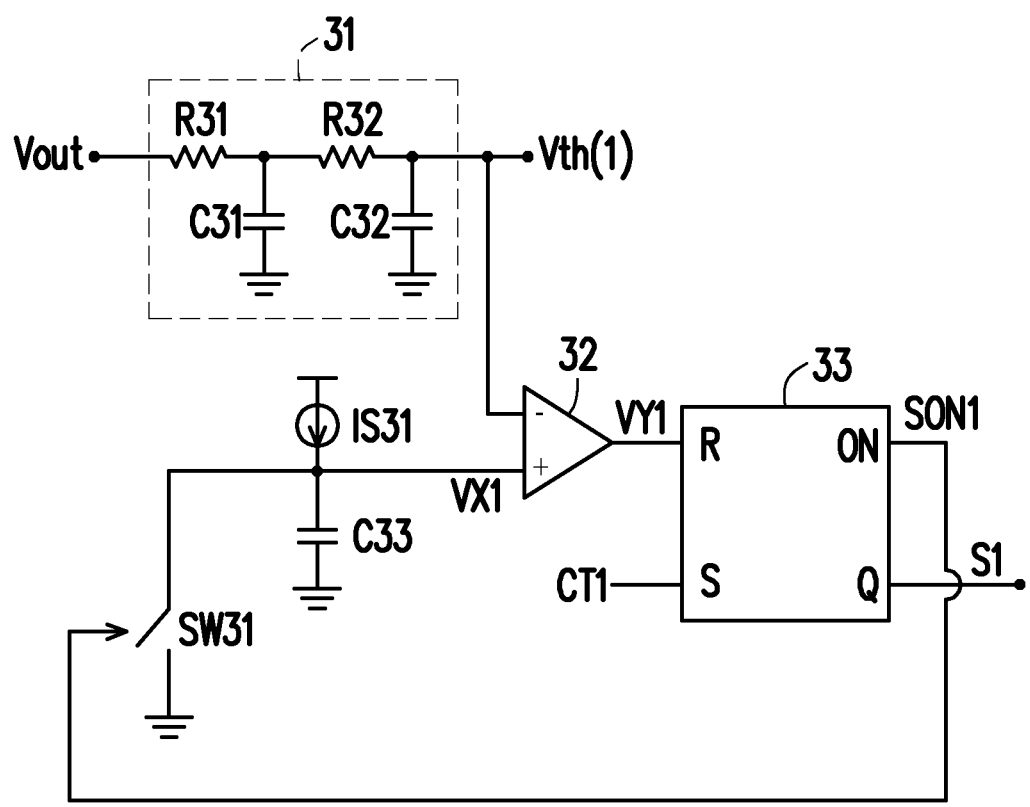
FIG. 3 is a schematic diagram of a first oscillation circuit shown according to an exemplary embodiment of the invention.

FIG. 3 is a schematic diagram of a first oscillation circuit shown according to an exemplary embodiment of the invention. Referring to FIG. 3, in an exemplary embodiment, the oscillation circuit 212 includes a feedback circuit 31, a comparator 32, and an oscillator 33. The feedback circuit 31 may be configured to generate a voltage (also referred to as a first threshold voltage) Vth(1) according to the voltage Vout. For example, the feedback circuit 31 may include a resistor R31, a resistor R32, a capacitor C31, and a capacitor C32.

The comparator 32 may receive the voltage Vth(1) and a voltage (also referred to as the first voltage) VX1. The comparator 32 may compare the voltages Vth(1) and VX1 and generate a signal VY1 according to the voltage difference between the voltages Vth(1) and VX1. The signal VY1 may reflect the voltage difference between the voltages Vth(1) and VX1. The oscillator 33 may receive the signals VY1 and CT1 and generate signals SON1 and S1. The signal CT1 may be configured to turn on the oscillator 33. When the oscillator 33 is on, the oscillator 33 may generate the signal S1 according to the signal VY1.

In an exemplary embodiment, the oscillation circuit 212 further includes a current source IS31, a capacitor C33, and a switch element SW31. The signal SON1 may be configured to turn on or off the switch element SW31. When the switch element SW31 is not in the on state, the current source IS31 may charge the capacitor C33 to increase the voltage value of the voltage VX1. In addition, when the switch element SW31 is in the on state, the capacitor C33 may be discharged to reduce the voltage value of the voltage VX1.

In an exemplary embodiment, when the oscillator 33 is on, if the signal VY1 reflects that the voltage value of the voltage VX1 is less than the voltage value of the voltage Vth(1), the oscillator 33 may generate one pulse wave in the signal S1 according to the signal VY1. In particular, during the period when the pulse wave is generated, the signal SON1 may continue to be pulled high to reflect the duration of the pulse wave. For example, the duration of one pulse wave may be directly related to the width of the pulse wave.

In an exemplary embodiment, in response to the signal SON1 being pulled high, the switch element SW31 may be turned off to increase the voltage value of the voltage VX1. Later, if the signal VY1 reflects that the voltage value of the voltage VX1 is increased to the same voltage value as the voltage Vth(1), the oscillator 33 may end the pulse wave according to the voltage VY1. For example, the time point at which the pulse wave ends (i.e., the edge position of the pulse wave) may correspond to the falling edge of the pulse wave in the signal S1. In response to the end of the pulse wave, the signal SON1 may be pulled low, and the switch element SW31 may be turned on. At this point, a single pulse wave having a specific width in the signal S1 may be generated. By repeatedly performing the above operation, a plurality of discontinuous pulse waves in the signal S1 may be generated one by one.

Figure 4:
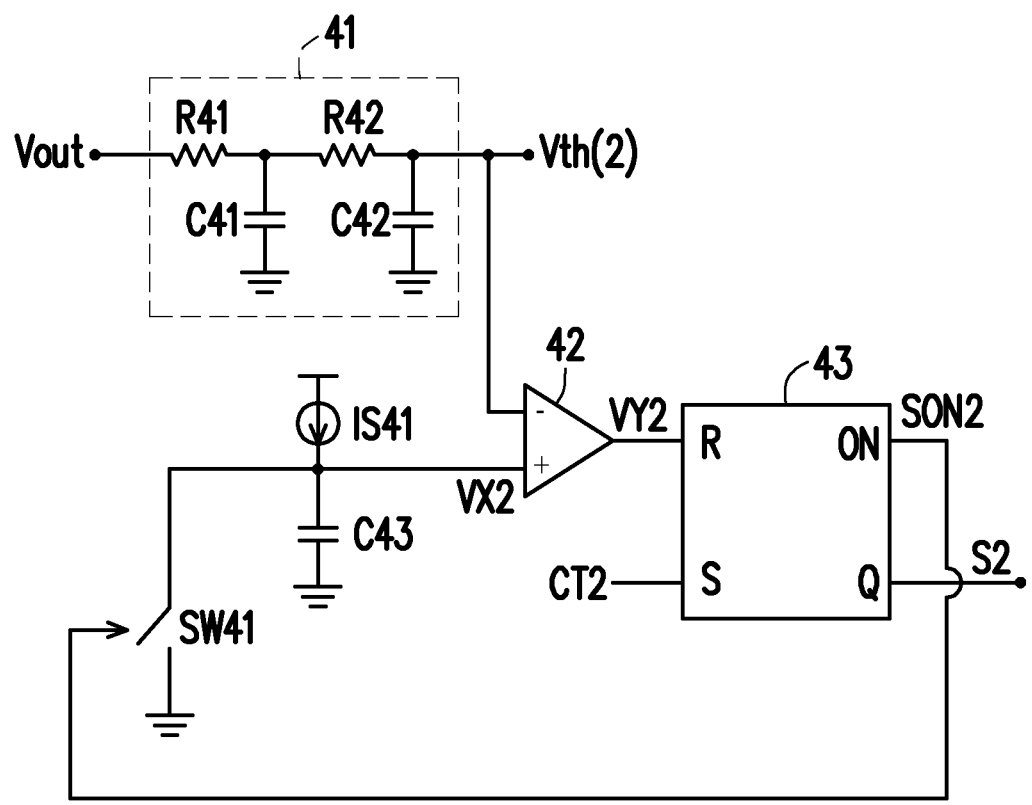
FIG. 4 is a schematic diagram of a second oscillation circuit shown according to an exemplary embodiment of the invention.

FIG. 4 is a schematic diagram of a second oscillation circuit shown according to an exemplary embodiment of the invention. Referring to FIG. 4, in an exemplary embodiment, the oscillation circuit 222 includes a feedback circuit 41, a comparator 42, and an oscillator 43. The feedback circuit 41 may be configured to generate a voltage (also referred to as a second threshold voltage) Vth(2) according to the voltage Vout. For example, the feedback circuit 41 may include a resistor R41, a resistor R42, a capacitor C41, and a capacitor C42.

The comparator 42 may receive the voltage Vth(2) and a voltage (also referred to as the second voltage) VX2. The comparator 42 may compare the voltages Vth(2) and VX2 and generate a signal VY2 according to the voltage difference between the voltages Vth(2) and VX2. The signal VY2 may reflect the voltage difference between the voltages Vth(2) and VX2. The oscillator 43 may receive the signals VY2 and CT2 and generate signals SON2 and S2. The signal CT2 may be configured to turn on the oscillator 43. When the oscillator 43 is on, the oscillator 43 may generate the signal S2 according to the signal VY2.

In an exemplary embodiment, the oscillation circuit 222 further includes a current source IS41, a capacitor C43, and a switch element SW41. The signal SON2 may be configured to turn on or off the switch element SW41. When the switch element SW41 is in the off state, the current source IS41 may charge the capacitor C43 to increase the voltage value of the voltage VX2. In addition, when the switch element SW41 is in the on state, the capacitor C43 may be discharged to reduce the voltage value of the voltage VX2.

In an exemplary embodiment, when the oscillator 43 is on, if the signal VY2 reflects that the voltage value of the voltage VX2 is less than the voltage value of the voltage Vth(2), the oscillator 43 may generate one pulse wave in the signal S2 according to the signal VY2. In particular, during the period when the pulse wave is generated, the signal SON2 may continue to be pulled high to reflect the duration of the pulse wave.

In an exemplary embodiment, in response to the signal SON2 being pulled high, the switch element SW41 may be turned off to increase the voltage value of the voltage VX2. Later, if the signal VY2 reflects that the voltage value of the voltage VX2 is increased to the same voltage value as the voltage Vth(2), the oscillator 43 may end the pulse wave according to the voltage VY2. For example, the time point at which the pulse wave ends (i.e., the edge position of the pulse wave) may correspond to the falling edge of the pulse wave in the signal S2. In response to the end of the pulse wave, the signal SON2 may be pulled low, and the switch element SW41 may be turned on. At this point, a single pulse wave having a specific width in the signal S2 may be generated. By repeatedly performing the above operation, a plurality of discontinuous pulse waves in the signal S2 may be generated one by one.

In an exemplary embodiment, the injection lock circuit 251 in FIG. 2 may further adjust the voltage Vth(2) in FIG. 4 (that is, the second threshold voltage) according to the pulse wave in the signal S1 (that is, the first pulse wave), and the voltage Vth(2) may be configured to affect the edge position of at least one pulse wave (i.e., the second pulse wave) generated in the signal S2. For example, if the voltage value of the voltage Vth(2) is increased, the edge position of at least one pulse wave generated in the signal S2 may be delayed. Or, if the voltage value of the voltage Vth(2) is reduced, the edge position of at least one pulse wave generated in the signal S2 may be advanced. This helps to lock the frequency difference and/or the phase difference between the signals S1 and S2.

In an exemplary embodiment, the injection lock circuit 252 in FIG. 2 may adjust the voltage Vth(1) in FIG. 3 (that is, the first threshold voltage) according to the pulse wave in the signal S2 (that is, the third pulse wave), and the voltage Vth(1) may be configured to affect the edge position of at least one pulse wave (i.e., the fourth pulse wave) generated in the signal S1. For example, if the voltage value of the voltage Vth(1) is increased, the edge position of at least one pulse wave generated in the signal S1 may be delayed. Or, if the voltage value of the voltage Vth(1) is reduced, the edge position of at least one pulse wave generated in the signal S1 may be advanced. This also helps to lock the frequency difference and/or the phase difference between the signals S1 and S2.

Figure 5:
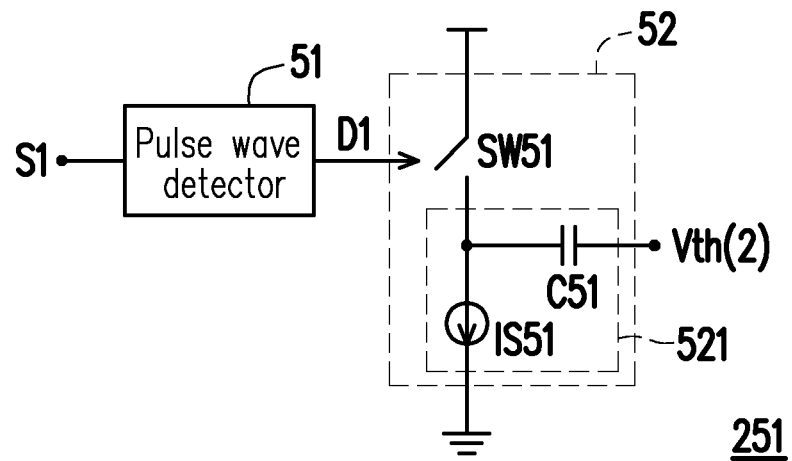
FIG. 5 is a schematic diagram of a first injection lock circuit shown according to an exemplary embodiment of the invention.

FIG. 5 is a schematic diagram of a first injection lock circuit shown according to an exemplary embodiment of the invention. Referring to FIG. 5, in an exemplary embodiment, the injection lock circuit 251 includes a pulse detector 51 and a voltage adjustment circuit 52. The pulse wave detector 51 may be configured to detect the pulse wave (i.e., the first pulse wave) in the signal S1 and generate a signal (also referred to as the first detection signal) D1. For example, the pulse wave detector 51 may be configured to detect the falling edge (i.e., edge position) of the first pulse wave in the signal S1. In response to the falling edge, the pulse wave detector 51 may generate the signal D1. For example, the signal D1 may reflect the edge position of the first pulse wave. The voltage adjustment circuit 52 is coupled to the pulse wave detector 51. The voltage adjustment circuit 52 may be configured to receive the signal D1 and adjust the voltage Vth(2) according to the signal D1.

In an exemplary embodiment, the voltage adjustment circuit 52 includes a switch element SW51 and a charge and discharge circuit 521. The switch element SW51 is coupled to the pulse wave detector 51. The charge and discharge circuit 521 is coupled to the switch element SW51. In an exemplary embodiment, the signal D1 may be configured to briefly turn on the switch element SW51. When the switch element SW51 is in the on state, the voltage adjustment circuit 52 may charge the capacitor C51 to increase the voltage value of the voltage Vth(2). Then, the switch element SW51 may be turned off. When the voltage value of the voltage Vth(2) is increased and the switch element SW51 is not in the on state, the voltage adjustment circuit 52 may discharge the capacitor C51 via the current source IS51 to reduce the voltage value of the voltage Vth(2).

In other words, in an exemplary embodiment, the injection lock circuit 251 may adjust (for example, intermittently increase and decrease) the voltage value of the voltage Vth(2) according to the edge position (such as the falling edge) of at least a portion of the pulse wave (i.e., the first pulse wave) in the signal S1. Thereby, the injection lock circuit 251 may control or adjust the edge position of the pulse wave (i.e., the second pulse wave) generated in the signal S2.

Figure 6:
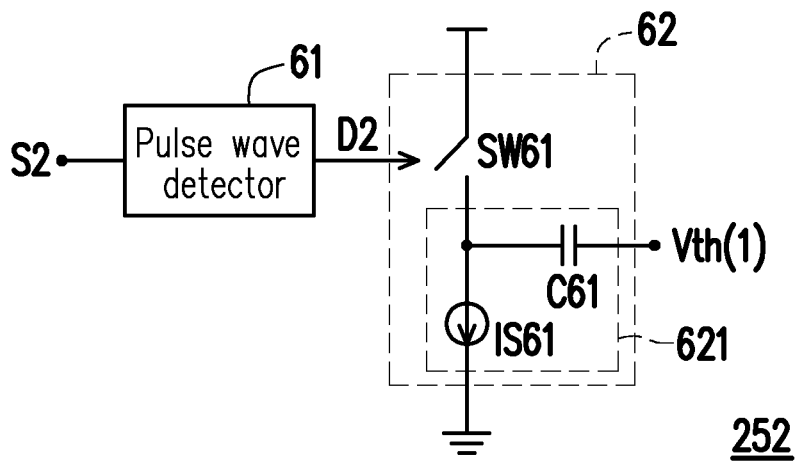
FIG. 6 is a schematic diagram of a second injection lock circuit shown according to an exemplary embodiment of the invention.

FIG. 6 is a schematic diagram of a second injection lock circuit shown according to an exemplary embodiment of the invention. Referring to FIG. 6, in an exemplary embodiment, the injection lock circuit 252 includes a pulse detector 61 and a voltage adjustment circuit 62. The pulse wave detector 51 may be configured to detect the pulse wave (i.e., the third pulse wave) in the signal S2 and generate a signal (also referred to as the second detection signal) D2. For example, the pulse wave detector 61 may be configured to detect the falling edge (i.e., edge position) of the third pulse wave in the signal S2. In response to the falling edge, the pulse wave detector 61 may generate the signal D2. For example, the signal D2 may reflect the edge position of the third pulse wave. The voltage adjustment circuit 62 is coupled to the pulse wave detector 61. The voltage adjustment circuit 62 may be configured to receive the signal D2 and adjust the voltage Vth(1) according to the signal D2.

In an exemplary embodiment, the voltage adjustment circuit 62 includes a switch element SW61 and a charge and discharge circuit 621. The switch element SW61 is coupled to the pulse wave detector 61. The charge and discharge circuit 621 is coupled to the switch element SW61. In an exemplary embodiment, the signal D2 may be configured to briefly turn on the switch element SW61. When the switch element SW61 is in the on state, the voltage adjustment circuit 62 may charge the capacitor C61 to increase the voltage value of the voltage Vth(1). Then, the switch element SW61 may be turned off. When the voltage value of the voltage Vth(1) is increased and the switch element SW61 is not in the on state, the voltage adjustment circuit 62 may discharge the capacitor C61 via the current source IS61 to reduce the voltage value of the voltage Vth(1).

In other words, in an exemplary embodiment, the injection lock circuit 252 may adjust (for example, intermittently increase and decrease) the voltage value of the voltage Vth(1) according to the edge position (such as the falling edge) of at least a portion of the pulse wave (i.e., the third pulse wave) in the signal S2. Thereby, the injection lock circuit 252 may control or adjust the edge position of the pulse wave (i.e., the fourth pulse wave) generated in the signal S1.

Figure 7:
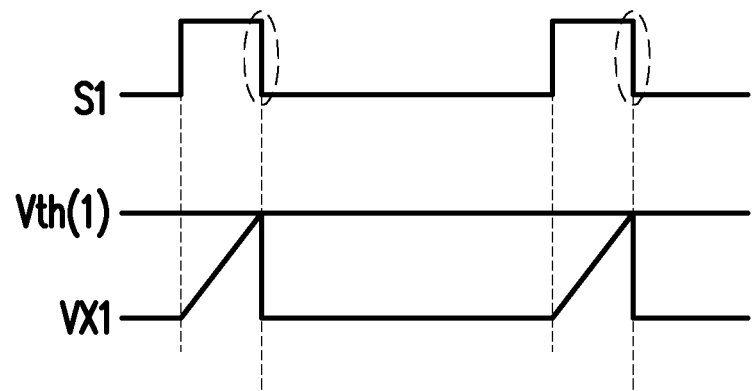
FIG. 7 is a schematic diagram of a first threshold voltage not changing over time shown according to an exemplary embodiment of the invention.

FIG. 7 is a schematic diagram of a first threshold voltage not changing over time shown according to an exemplary embodiment of the invention. Referring to FIG. 3 and FIG. 7, in an exemplary embodiment, when the voltage Vth(1) is not dynamically adjusted, the voltage Vth(1) is ideally set to the initial value of the voltage Vth(1) according to the voltage Vout. During the period when the oscillator 33 is on, if the voltage value of the voltage VX1 is less than the voltage value of the voltage Vth(1), a single pulse wave in the signal S1 may be generated and maintained. Later, when the voltage value of the voltage VX1 is increased to the same voltage value as the voltage Vth(1), the pulse wave may be terminated. In addition, during the period when the oscillator 33 is not on, there may be no pulse wave in the signal S1.

Figure 8:
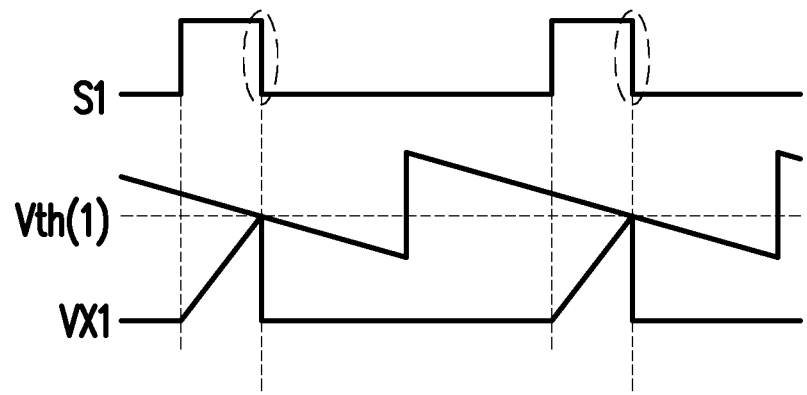
FIG. 8 is a schematic diagram of a first threshold voltage changing over time shown according to an exemplary embodiment of the invention.

FIG. 8 is a schematic diagram of a first threshold voltage changing over time shown according to an exemplary embodiment of the invention. Please refer to FIG. 6 and FIG. 8. When the voltage Vth(1) may be dynamically adjusted, the voltage value of the voltage Vth(1) may change with time under the control of the injection lock circuit 252. In particular, by adjusting the slope of the voltage value of the voltage Vth(1) with respect to time, the injection lock circuit 252 may accurately control (for example, advance or delay) the edge position of at least a portion of the pulse wave in the signal S1 to lock the frequency difference and/or the phase difference between the signals S1 and S2. In addition, the relationship between the voltage value of the voltage Vth(1) and time may be a linear or nonlinear relationship, and the invention is not limited thereto.

Figure 9:
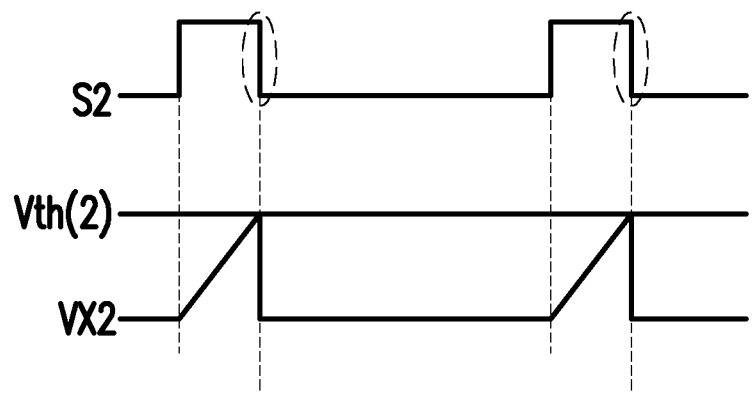
FIG. 9 is a schematic diagram of a second threshold voltage not changing over time shown according to an exemplary embodiment of the invention.

FIG. 9 is a schematic diagram of a second threshold voltage not changing over time shown according to an exemplary embodiment of the invention. Referring to FIG. 4 and FIG. 9, in an exemplary embodiment, when the voltage Vth(2) is not dynamically adjusted, the voltage Vth(2) is ideally set to the initial value of the voltage Vth(2) according to the voltage Vout. During the period when the oscillator 43 is on, if the voltage value of the voltage VX2 is less than the voltage value of the voltage Vth(2), a single pulse wave in the signal S2 may be generated and maintained. Later, when the voltage value of the voltage VX2 is increased to the same voltage value as the voltage Vth(2), the pulse wave may be terminated. In addition, during the period when the oscillator 43 is not on, there may be no pulse wave in the signal S2.

Figure 10:
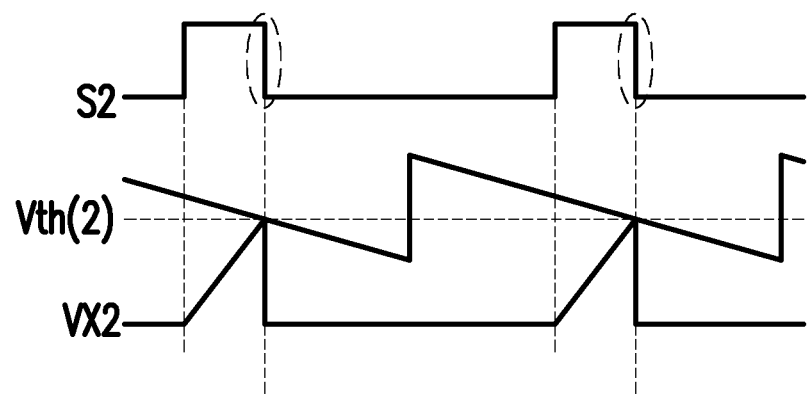
FIG. 10 is a schematic diagram of a second threshold voltage changing over time shown according to an exemplary embodiment of the invention.

FIG. 10 is a schematic diagram of a second threshold voltage changing over time shown according to an exemplary embodiment of the invention. Please refer to FIG. 5 and FIG. 10. When the voltage Vth(2) may be dynamically adjusted, the voltage value of the voltage Vth(2) may change with time under the control of the injection lock circuit 251. In particular, by adjusting the slope of the voltage value of the voltage Vth(2) with respect to time, the injection lock circuit 251 may accurately control (for example, advance or delay) the edge position of at least a portion of the pulse wave in the signal S2 to lock the frequency difference and/or the phase difference between the signals S1 and S2. In addition, the relationship between the voltage value of the voltage Vth(2) and time may also be a linear or nonlinear relationship, and the invention is not limited thereto.

It should be noted that all circuit structures shown in FIG. 1 to FIG. 6 are only examples and are not intended to limit the invention. In all the circuit structures shown in FIG. 1 to FIG. 6, the coupling relationship between the electronic circuits and/or electronic elements may also be adjusted according to practical needs, and the invention is not limited thereto. In an exemplary embodiment, in all circuit structures shown in FIG. 1 to FIG. 6, each electronic circuit and/or electronic element may also be replaced by an electronic circuit and/or electronic element having the same or similar functions, and the invention is not limited thereto. In addition, all circuit structures shown in FIG. 1 to FIG. 6 may also include other types of electronic circuits and/or electronic elements to provide additional functions, and the invention is not limited thereto.

In an exemplary embodiment, the voltage control circuit module 10 of FIG. 1 may be disposed in one memory storage device or one memory control circuit unit to be operated together with the memory storage device or the memory control circuit unit. However, in an exemplary embodiment, the voltage control circuit module 10 of FIG. 1 may also be disposed in other types of electronic devices, and the invention is not limited thereto.

Figure 11:
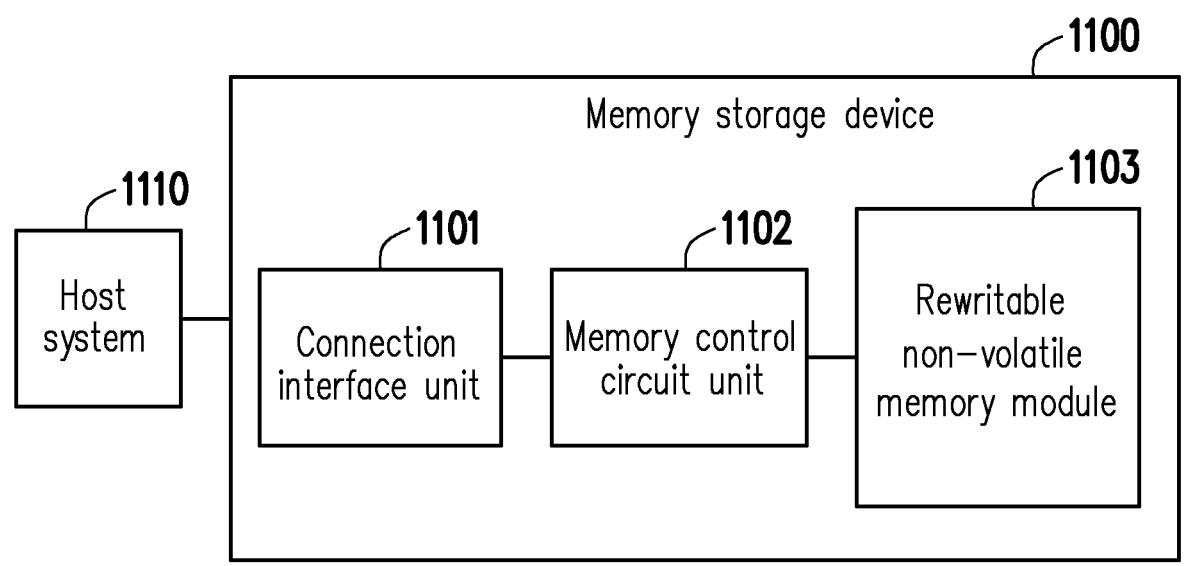
FIG. 11 is a schematic diagram of a memory storage device shown according to an exemplary embodiment of the invention.

FIG. 11 is a schematic diagram of a memory storage device shown according to an exemplary embodiment of the invention. Referring to FIG. 11, a memory storage device 1100 may be used with a host system 1110. For example, the host system 1110 may write data into the memory storage device 1100 or read data from the memory storage device 1100. The host system 1110 may be any system that may substantially cooperate with the memory storage device 1100 to store data, such as smart phones, tablets, desktop computers, notebook computers, digital cameras, video cameras, communication devices, audio players, or video players, etc.

The memory storage device 1100 includes a connection interface unit 1101, a memory control circuit unit 1102, and a rewritable non-volatile memory module 1103. The connection interface unit 1101 is configured to connect the memory storage device 1100 to the host system 1110. For example, the connection interface unit 1101 is compatible with Serial Advanced Technology Attachment (SATA) standard, Parallel Advanced Technology Attachment (PATA) standard, Peripheral Component Interconnect Express (PCI Express) standard, Universal Serial Bus (USB) standard, or other suitable standards. The connection interface unit 1101 may be sealed in a chip with the memory control circuit unit 1102. Alternatively, the connection interface unit 1101 may also be disposed outside of a chip containing the memory control circuit unit 1102.

The memory control circuit unit 1102 is configured to execute a plurality of logic gates or control instructions implemented in hardware mode or firmware mode. The memory control circuit unit 1102 may perform operations such as writing, reading, and erasing data in the rewritable non-volatile memory module 1103 according to instructions from the host system 1110.

The rewritable non-volatile memory module 1103 may be coupled to the memory control circuit unit 1102 and configured to store data written by the host system 1110. For example, the rewritable non-volatile memory module 1103 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules having the same or similar characteristics.

In an exemplary embodiment, the rewritable non-volatile memory module 1103 of FIG. 11 may include a flash memory module. In an exemplary embodiment, the memory control circuit unit 1102 of FIG. 11 may include a flash memory controller configured to control a flash memory module.

In an exemplary embodiment, the voltage control circuit module 10 of FIG. 1 may be disposed in the connection interface unit 1101, the memory control circuit unit 1102, and/or the rewritable non-volatile memory module 1103 of FIG. 11 to provide power to the connection interface unit 1101, the memory control circuit unit 1102, and/or the rewritable non-volatile memory module 1103.

In an exemplary embodiment, the voltage control circuit module 10 of FIG. 1 may be coupled to the connection interface unit 1101, the memory control circuit unit 1102, and/or the rewritable non-volatile memory module 1103 of FIG. 11 to provide power to the connection interface unit 1101, the memory control circuit unit 1102, and/or the rewritable non-volatile memory module 1103.

Figure 12:
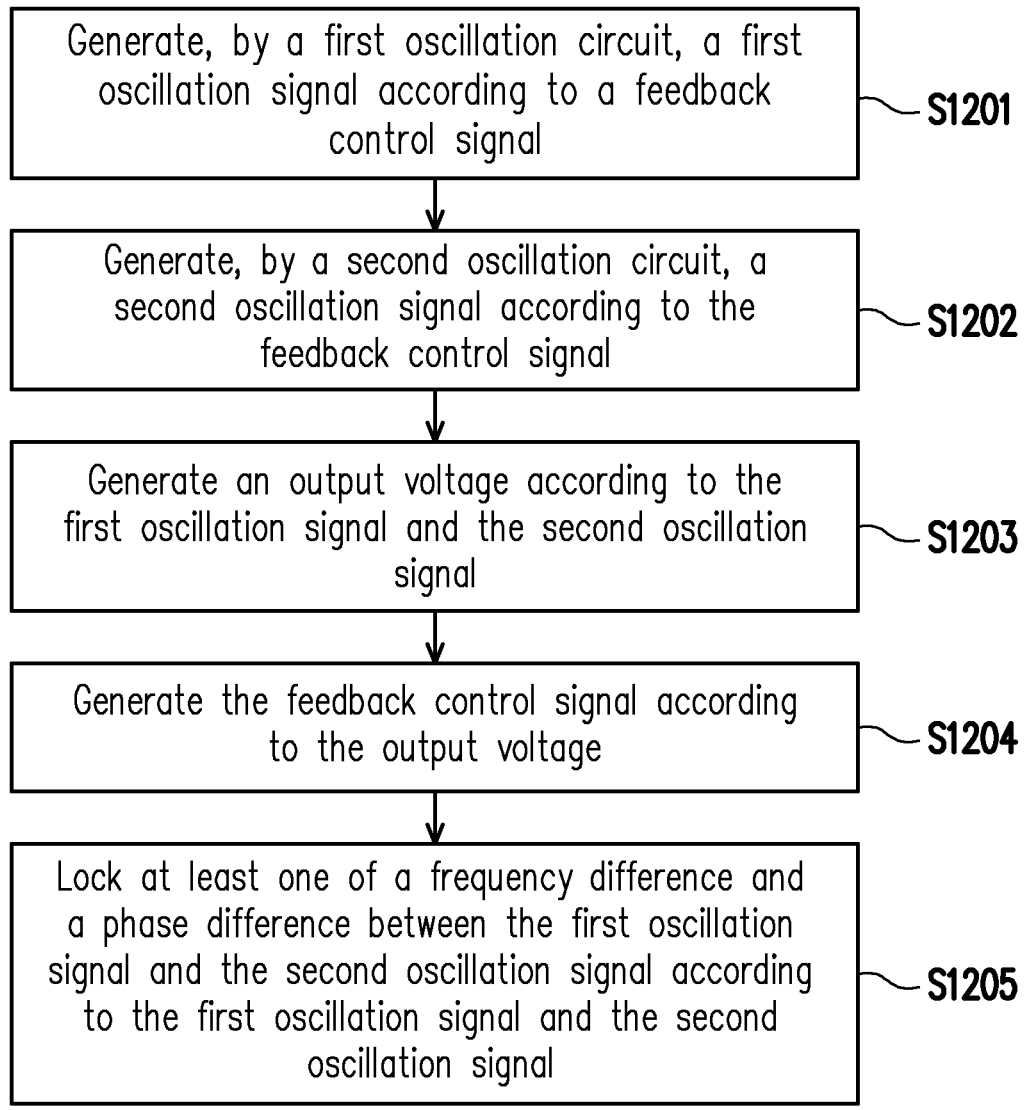
FIG. 12 is a flowchart of a spread spectrum clock generation method shown according to an exemplary embodiment of the invention.

FIG. 12 is a flowchart of a spread spectrum clock generation method shown according to an exemplary embodiment of the invention. Referring to FIG. 12, in step S1201, a first oscillation signal is generated according to a feedback control signal by a first oscillation circuit. In step S1202, a second oscillation signal is generated according to the feedback control signal by a second oscillation circuit. In step S1203, an output voltage is generated according to the first oscillation signal and the second oscillation signal. In step S1204, a feedback control signal is generated according to the output voltage. In step S1205, at least one of a frequency difference and a phase difference between the first oscillation signal and the second oscillation signal is locked according to the first oscillation signal and the second oscillation signal.

However, each step in FIG. 12 is as described in detail above, and is not repeated herein. It should be mentioned that, each step in FIG. 12 may be implemented as a plurality of program codes or circuits, and the invention is not limited thereto. Moreover, the method of FIG. 12 may be used with the above exemplary embodiments, and may also be used alone, and the invention is not limited thereto.

Based on the above, the voltage control circuit module, the memory storage device, and the voltage control method provided by the exemplary embodiments of the invention can, by dynamically adjusting the threshold voltage used by at least one oscillation circuit, lock the frequency difference and/or the phase difference between the plurality of oscillation signals. Thereby, the voltage control efficiency of the output voltage may be improved in a system architecture in which the plurality of oscillation circuits generate oscillation signals respectively.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A voltage control circuit module, comprising:
a first oscillation circuit;
a second oscillation circuit;
a voltage output circuit coupled to the first oscillation circuit and the second oscillation circuit;
a feedback control circuit coupled to the first oscillation circuit, the second oscillation circuit, and the voltage output circuit; and
an injection lock circuit coupled to the first oscillation circuit and the second oscillation circuit,
wherein the first oscillation circuit is configured to generate a first oscillation signal according to a feedback control signal,
the second oscillation circuit is configured to generate a second oscillation signal according to the feedback control signal, the voltage output circuit is configured to generate an output voltage according to the first oscillation signal and the second oscillation signal, the feedback control circuit is configured to generate the feedback control signal according to the output voltage, and the injection lock circuit is configured to lock at least one of a frequency difference and a phase difference between the first oscillation signal and the second oscillation signal according to the first oscillation signal and the second oscillation signal.

2. The voltage control circuit module of claim 1, wherein the injection lock circuit comprises:

a first injection lock circuit coupled to the first oscillation circuit and the second oscillation circuit, wherein the first injection lock circuit is configured to adjust an edge position of a second pulse wave in the second oscillation signal according to a first pulse wave in the first oscillation signal.

3. The voltage control circuit module of claim 2, wherein the operation of the first injection lock circuit adjusting the edge position of the second pulse wave in the second oscillation signal according to the first pulse wave in the first oscillation signal comprises:

adjusting a threshold voltage according to the first pulse wave in the first oscillation signal, wherein the threshold voltage is configured to affect the edge position of the second pulse wave in the second oscillation signal.

4. The voltage control circuit module of claim 3, wherein the first injection lock circuit comprises:

a pulse wave detector coupled to the first oscillation circuit; and a voltage adjustment circuit coupled to the pulse wave detector and the second oscillation circuit, wherein the pulse wave detector is configured to detect the first pulse wave in the first oscillation signal and generate a detection signal, and the voltage adjustment circuit is configured to adjust the threshold voltage according to the detection signal.

5. The voltage control circuit module of claim 4, wherein the voltage adjustment circuit comprises:

a switch element coupled to the pulse wave detector; and a charge and discharge circuit coupled to the switch element and the second oscillation circuit, wherein the switch element is configured to switch a conducting state according to a first detection signal, and the charge and discharge circuit is configured to adjust the threshold voltage in response to the switch element being turned on or off.

6. The voltage control circuit module of claim 3, wherein the second oscillation circuit comprises:

a comparator coupled to the voltage output circuit; and an oscillator coupled to the comparator and the feedback control circuit, wherein the comparator is configured to compare a first voltage and the threshold voltage, and the oscillator is configured to generate the second pulse wave in the second oscillation signal according to the feedback control signal and an output of the comparator.

7. The voltage control circuit module of claim 3, wherein the second oscillation circuit is further configured to set an initial value of the threshold voltage according to the output voltage.

8. The voltage control circuit module of claim 2, wherein the injection lock circuit further comprises:

a second injection lock circuit coupled to the first oscillation circuit and the second oscillation circuit, wherein the second injection lock circuit is configured to adjust an edge position of a fourth pulse wave in the first oscillation signal according to a third pulse wave in the second oscillation signal.

9. The voltage control circuit module of claim 1, wherein the voltage output circuit comprises:

a low-pass filter circuit coupled to the first oscillation circuit, the second oscillation circuit, and the feedback control circuit, wherein the low-pass filter circuit is configured to generate the output voltage according to the first oscillation signal and the second oscillation signal.

10. The voltage control circuit module of claim 1, wherein the first oscillation circuit and the second oscillation circuit may be in an on state at the same time.

11. A memory storage device, comprising:

a connection interface unit configured to be coupled to a host system;

a rewritable non-volatile memory module;

a memory control circuit unit coupled to the connection interface unit and the rewritable non-volatile memory module; and a voltage control circuit module disposed in the connection interface unit, the rewritable non-volatile memory module, or the memory control circuit unit, wherein the voltage control circuit module is configured to:

generate, by a first oscillation circuit, a first oscillation signal according to a feedback control signal;

generate, by a second oscillation circuit, a second oscillation signal according to the feedback control signal;

generate an output voltage according to the first oscillation signal and the second oscillation signal;

generate the feedback control signal according to the output voltage; and lock at least one of a frequency difference and a phase difference between the first oscillation signal and the second oscillation signal according to the first oscillation signal and the second oscillation signal.

12. The memory storage device of claim 11, wherein the voltage control circuit module comprises an injection lock circuit, the injection lock circuit is configured to adjust an edge position of a second pulse wave in the second oscillation signal according to a first pulse wave in the first oscillation signal.

13. The memory storage device of claim 12, wherein the operation of the injection lock circuit adjusting the edge position of the second pulse wave in the second oscillation signal according to the first pulse wave in the first oscillation signal comprises:

adjusting a threshold voltage according to the first pulse wave in the first oscillation signal, wherein the threshold voltage is configured to affect the edge position of the second pulse wave in the second oscillation signal.

14. The memory storage device of claim 13, wherein the injection lock circuit comprises:

a pulse wave detector; and a voltage adjustment circuit coupled to the pulse wave detector, wherein the pulse wave detector is configured to detect the first pulse wave in the first oscillation signal and generate a detection signal, and the voltage adjustment circuit is configured to adjust the threshold voltage according to the detection signal.

15. The memory storage device of claim 14, wherein the voltage adjustment circuit comprises:
a switch element coupled to the pulse wave detector; and
a charge and discharge circuit coupled to the switch element,
wherein the switch element is configured to switch a conducting state according to a first detection signal, and
the charge and discharge circuit is configured to adjust the threshold voltage in response to the switch element being turned on or off.

16. The memory storage device of claim 13, wherein the voltage control circuit module comprises:
a comparator; and
an oscillator coupled to the comparator,
wherein the comparator is configured to compare a first voltage and the threshold voltage, and
the oscillator is configured to generate the second pulse wave in the second oscillation signal according to the feedback control signal and an output of the comparator.

17. The memory storage device of claim 13, wherein the voltage control circuit module is further configured to set an initial value of the threshold voltage according to the output voltage.

18. The memory storage device of claim 12, wherein the injection lock circuit is further configured to adjust an edge position of a fourth pulse wave in the first oscillation signal according to a third pulse wave in the second oscillation signal.

19. The memory storage device of claim 11, wherein the voltage control circuit module comprises a low-pass filter circuit,
the low-pass filter circuit is configured to generate the output voltage according to the first oscillation signal and the second oscillation signal.

20. The memory storage device of claim 11, wherein the first oscillation circuit and the second oscillation circuit may be in an on state at the same time.

21. A voltage control method, configured for a memory storage device, the voltage control method comprising:
generating, by a first oscillation circuit, a first oscillation signal according to a feedback control signal;
generating, by a second oscillation circuit, a second oscillation signal according to the feedback control signal;
generating an output voltage according to the first oscillation signal and the second oscillation signal;
generating the feedback control signal according to the output voltage; and
locking at least one of a frequency difference and a phase difference between the first oscillation signal and the second oscillation signal according to the first oscillation signal and the second oscillation signal.

22. The voltage control method of claim 21, wherein the step of locking the at least one of the frequency difference and the phase difference between the first oscillation signal and the second oscillation signal according to the first oscillation signal and the second oscillation signal comprises:
adjusting an edge position of a second pulse wave in the second oscillation signal according to a first pulse wave in the first oscillation signal.

23. The voltage control method of claim 22, wherein the step of adjusting the edge position of the second pulse wave in the second oscillation signal according to the first pulse wave in the first oscillation signal comprises:
adjusting a threshold voltage according to the first pulse wave in the first oscillation signal,
wherein the threshold voltage is configured to affect the edge position of the second pulse wave in the second oscillation signal.

24. The voltage control method of claim 23, wherein the step of adjusting the threshold voltage according to the first pulse wave in the first oscillation signal comprises:
detecting the first pulse wave in the first oscillation signal and generating a detection signal; and
adjusting the threshold voltage according to the detection signal.

25. The voltage control method of claim 24, wherein the step of adjusting the threshold voltage according to the detection signal comprises:
switching a conducting state of a switch element according to a first detection signal; and
adjusting the threshold voltage in response to the switch element being turned on or off.

26. The voltage control method of claim 23, wherein the step of adjusting the edge position of the second pulse wave in the second oscillation signal according to the first pulse wave in the first oscillation signal comprises:
comparing a first voltage and the threshold voltage by a comparator; and
generating the second pulse wave in the second oscillation signal according to the feedback control signal and an output of the comparator.

27. The voltage control method of claim 23, further comprising:
setting an initial value of the threshold voltage according to the output voltage.

28. The voltage control method of claim 22, wherein the step of locking the at least one of the frequency difference and the phase difference between the first oscillation signal and the second oscillation signal according to the first oscillation signal and the second oscillation signal comprises:
adjusting an edge position of a fourth pulse wave in the first oscillation signal according to a third pulse wave in the second oscillation signal.

29. The voltage control method of claim 21, wherein the step of generating the output voltage according to the first oscillation signal and the second oscillation signal comprises:
generating, by a low-pass filter circuit, the output voltage according to the first oscillation signal and the second oscillation signal.

30. The voltage control method of claim 21, wherein the first oscillation circuit and the second oscillation circuit may be in an on state at the same time.

* * * * *